United States Patent [19]
Houston

[11] Patent Number: 6,121,658
[45] Date of Patent: Sep. 19, 2000

[54] DEEP MESA ISOLATION

[75] Inventor: Theodore W. Houston, Richardson, Tex.

[73] Assignee: Texas Instruments Incorporated, Dallas, Tex.

[21] Appl. No.: 08/695,495

[22] Filed: Aug. 12, 1996

Related U.S. Application Data

[62] Division of application No. 08/412,429, Mar. 29, 1995, Pat. No. 5,795,810.

[51] Int. Cl.$^7$ .......................... H01L 27/01; H01L 27/12; H01L 31/0392
[52] U.S. Cl. .......................... 257/347; 257/350; 257/354; 257/349
[58] Field of Search ................................ 257/347, 349, 257/350, 354

[56] References Cited

U.S. PATENT DOCUMENTS

| | | | |
|---|---|---|---|
| 4,800,527 | 1/1989 | Ozaki et al. | 257/347 |
| 4,914,628 | 4/1990 | Nishimura | 257/350 |
| 5,241,211 | 8/1993 | Tashiro | 257/347 |
| 5,581,101 | 12/1996 | Ning et al. | 257/347 |

FOREIGN PATENT DOCUMENTS

| | | | |
|---|---|---|---|
| 4-179271 | 11/1990 | Japan . | |
| 4-212451 | 3/1991 | Japan . | |
| 4-179271 | 6/1992 | Japan | 257/350 |
| 4-212451 | 8/1992 | Japan | 257/350 |

*Primary Examiner*—Mahshid Saadat
*Assistant Examiner*—Jhihan B Clark
*Attorney, Agent, or Firm*—Wade James Brady, III; Frederick J. Telecky, Jr.

[57] ABSTRACT

A method of making an integrated circuit in semiconductor on insulator material and the circuit which comprises providing a semiconductor on insulator structure having a device layer, preferably silicon, and an electrically insulating layer, the device layer being in contact with one surface of the electrically insulating layer. An underlayer is provided which contacts the opposing surface of the electrically insulating layer. The structure is then patterned and trenches are etched to expose a surface of the underlying layer and to form mesas extending from the underlying layer. Ions can now optionally be implanted into selected regions of the underlying layer. A dielectric is provided between the mesas extending to or into the substrate and fabrication of the integrated circuit is then completed. The dielectric can be a thermal oxide at the exposed surface with a dielectric over the thermal oxide. Prior to formation of the thermal oxide, a sidewall dielectric can be formed over the electrically conductive layer. The exposed surface of the dielectric between the mesas is preferably substantially coplanar with the top surface of the mesas.

8 Claims, 1 Drawing Sheet

DEEP MESA ISOLATION

This application is a Division of application Ser. No. 08/412,429, filed Mar. 29, 1995, now U.S. Pat. No. 5,795,810.

BACKGROUND OF THE INVENTION

1. Field of the Invention

This invention relates to a method of fabricating integrated circuit devices having electrically isolated mesas and the structure.

2. Brief Description of the Prior Art

In the fabrication of integrated circuits, it is often necessary to provide one or more levels of interconnect on the chip. Since the levels of interconnect are generally current carrying metals and the levels of interconnect are separated from each other and from the substrate by an insulator, there effectively exists a capacitor between the interconnect levels themselves and between interconnect levels and the substrate, resulting in a capacitive effect between the layers of interconnect per se and/or the substrate. It is well known that this capacitive effect reduces the operating speed of the integrated circuit. Accordingly, the art is constantly attempting to find ways to decrease the capacitive effect between layers of interconnect and/or the substrate in order to increase the speed of circuit operation.

The above described problem also exists in integrated circuits having plural spaced apart mesas wherein the interconnects travel between the mesas over buried oxide layers disposed between the mesas as well as with interconnects travelling between elements in a single mesa. In such arrangements, there is a capacitance set up between the interconnect, which can be metal or doped semiconductor material, generally doped silicon, and the substrate as well as between adjacent mesas.

SUMMARY OF THE INVENTION

In accordance with the present invention, the capacitance generated between the interconnect and the substrate in the region between the mesas is decreased relative to prior art structures.

Briefly, the mesas are formed in standard manner by initially providing a standard semiconductor on insulator (SOI) structure (while "SOI" is generally used in the art to denote silicon-on-insulator, it is used herein in the broader sense as above defined) having a semiconductor device layer, generally silicon, on a buried insulator, generally silicon oxide, supported by an underlying layer, generally a semiconductor region, and, more specifically generally a silicon substrate. A metal or semiconductor region providing interconnect and/or other standard structural features can be included in the buried insulator. The semiconductor layer, which is generally but need not be a silicon layer, is generally a thin film, generally in the range of 10 nm to 5 $\mu$m in thickness, generally of uniform thickness, and in which transistors and on and in which interconnects are fabricated. The interconnects can be a doped portion of the semiconductor layer and/or metallization and/or polysilicon formed over the semiconductor layer and/or a layer of metallization and/or polysilicon over dielectric.

In the formation of the transistors in the semiconductor layer, portions of the semiconductor layer are isolated from each other in standard manner, such as, for example, by etching trenches through the layer using a pattern generally referred to as a moat pattern. The space between the isolated portions of the semiconductor layers is generally referred to as the field and the regions containing the semiconductor layers are referred to as mesas. It should be understood that the terms "moat" and "mesa" are used interchangeably herein to describe the device pattern in the silicon level. The term "moat" is generally used to describe bulk processes where isolation is provided with LOCOS whereas the term "mesa" is generally used to describe structures where the silicon is etched away in the field region, such as by forming trenches, leaving raised "mesas" for the devices.

A feature of the invention is that the mesa-forming etch need not stop at the buried insulator, but can continue therethrough into the layer underlying the buried insulator which is generally, but not always, the substrate. When the etched region is filled with a dielectric, this can result in an increase in the thickness of the field dielectric to reduce capacitance to the substrate and/or underlying layer of conductors crossing the field region. Other benefits can be obtained since this procedure allows patterning of the substrate or a buried conductor layer in the buried insulator within the restrictions of the moat (mesa) pattern. The mesa pattern can be modified from that which it might otherwise have been in order to allow a desired patterning of the substrate or buried conductor. The patterning of the substrate or buried conductor can be identical to the mesas or it can be patterned differently, within the restrictions of the mesa pattern. For example, the substrate pattern can exclude the portion of the mesa pattern between two adjacent mesas such that the two mesas will then be contained within a single substrate region. The substrate pattern can also be modified from the mesa pattern to allow a substrate contact within a wide mesa spacing.

Since ion implantation can take place through both the semiconductor layer and the buried insulator into the substrate by providing appropriate thicknesses of semiconductor layer and buried insulator, the equivalent of a well can be formed to supply separate back gate bias to n- and p-channel transistors formed in the semiconductor layer by such ion implantation. The disadvantage of these wells is the possible introduction of junction leakage between the wells. However, by patterning trenches into the substrate in accordance with the present invention, the potential for well junction leakage is significantly reduced. Separate well patterns, that can each include single or multiple mesa patterns, can be maintained at different electric potentials with reduced leakage. For further flexibility, the mesa pattern can form separate mesas for the transistors that are to be in separate wells where they might otherwise have been in a common mesa.

Implantation of ions into the substrate can also form conducting paths such as, for example, for ground and $V_{CC}$ busses. Trenches into the substrate can reduce potential junction leakage as in the case of well formation discussed above.

Noise coupling through the substrate is reduced by SOI technology relative to bulk. Such noise coupling is further reduced by trenches in the substrate to increase the isolation of selected segments of the circuit (e.g. separating the analog from the digital portion or isolating output drivers).

Though ions can be implanted into an underlying layer through the semiconductor film and buried insulator, there is a limit to doping density that can be obtained without appreciable doping of or infliction of damage to the semiconductor film. A heavier doping is obtainable in the field region. This fact can be used to provide lower resistivity borders to the well region and contacts to the well can be made in these more heavily doped regions. These more heavily doped regions can also be used for busses with contacts to individual mesas being made through the mesa to adjacent heavily doped regions under the mesa.

The SOI structure can be fabricated by implantation of oxygen into a semiconductor, preferably silicon, wafer followed by a high temperature anneal. This is referred to as SIMOX (separation by implantation of oxygen). With SIMOX, it is possible to form buried conductors by growing an epitaxial layer between separate steps of oxygen implantation.

Another way to form SOI is to bond the oxidized surface of one semiconductor wafer to the surface of another semiconductor wafer and then polish or etch back one of the original wafers to form a thin semiconductor film separated by an oxide from the substrate. With bonding, buried conductors are incorporated by adding conducting and dielectric layers to one or both wafers before bonding.

The above described structure is patterned for etching of the spaced apart mesas and the structure is then etched through the semiconductor and insulator layers and into the underlying layer such as the substrate to provide the mesa structures extending above the underlying layer or substrate with the underlying layer or substrate exposed between the mesas. The regions between the mesas are filled with a low-k dielectric material which, preferably has a lower k than the buried oxide, for example, with a flowable dielectric, such as spin-on-glass (SOG) or a silsesquioxane (SiQ) such as hydrogen silsesquioxane (HSQ) or with a deposited conformal dielectric such as tetraethyl orthosilicate (TEOS) to provide a reduction in capacitance across this region of fill material when the fill material has replaced the buried oxide with the same layer thickness. The fill material initially covers the mesas as well as filling the space between the mesas to provide a near planar surface after subsequent processing (e.g. resist etch back or chemical mechanical polishing). The fill material disposed over the mesas is removed by an etch or chemical-mechanical polish (CMP). The structure can have additional layers of insulator and interconnect (which can be metal, doped silicon or a combination thereof) as well as other structural features required of integrated circuit devices which are fabricated prior to and/or subsequent to the process steps of the present invention. Further standard processing can then proceed to complete a desired integrated circuit. The result is a thicker field dielectric and/or a lower-k field dielectric than is provided in prior art structures. In the event a sidewall oxide or sidewall implant into the semiconductor or dielectric layer is required, this step is provided prior to filling the region between the mesas with the dielectric material.

As a second embodiment of the invention, the etching step which forms the mesas as described above is stopped approximately at the underlying layer or substrate rather than continuing into the underlying layer or substrate with the underlying layer or substrate exposed in the etched regions. The exposed portions of the underlying layer or substrate are then oxidized to form a thick dielectric in the field between the mesas and extending into the underlying layer or substrate. In this embodiment, a sidewall nitride can optionally be applied to the sidewalls of the semiconductor layer prior to oxidizing the exposed underlying layer or substrate in order to avoid oxidizing the edges of the semiconductor pattern.

In a still further embodiment of the invention, ions are implanted into the underlying layer in regions underlying the semiconducting layer where the semiconductor layer has been removed. Such doped regions can provide conductive paths or contact regions to the substrate or wells.

Junction leakage and junction capacitance are both a function of doping levels, the junction leakage and junction capacitance being higher for more highly doped junctions. A trench can isolate more highly doped regions from each other, thereby avoiding the highly doped junctions and leaving only less highly doped (lower capacitance and lower leakage) junctions.

DESCRIPTION OF THE PREFERRED EMBODIMENT

Figure 1:
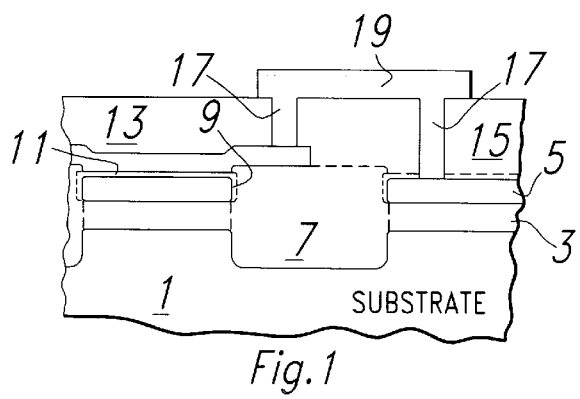
FIG. 1 is a cross sectional view of a partially fabricated integrated circuit in accordance with the present invention.

Referring first to FIG. 1, there is shown a first embodiment of a partially fabricated integrated circuit structure in accordance with the present invention. There is provided a silicon substrate 1 which is generally lightly doped in standard manner over which has been formed a layer of buried oxide (BOX) 3 with a layer of electrically conductive material 5 thereover in the form of a layer of silicon in standard manner. Optionally, implants can be made through the layers 3 and 5 into the substrate 1. The structure is then patterned with resist and etched in standard manner through the layer of silicon 5, through the buried oxide 3 and partially into the substrate 1 to form plural spaced apart mesa structures extending upwardly from the substrate. Optionally, a sidewall oxide 9 can be formed on the exposed sides of layer 5, either before or after extending the etch into substrate 1. Optionally, if it is desired to form doped regions in the substrate 1 in the field areas, this can be done at this time by implanting ions into selected regions of the substrate. Further, optionally, other structures, such as silicide formation or deposition of metal can be provided in the substrate at this time, as restricted by the mesa pattern.

The space between the mesa structures is then filled with a dielectric material 7, preferably with a low dielectric constant, such as hydrogen silsesquioxane (HSQ), preferably to a level to provide an approximately planar surface at the top surfaces of the mesas after processing. Fabrication of active and/or passive devices and interconnect now continues in standard manner to complete the desired integrated circuit structure. FIG. 1 illustrates gate oxide 11, polysilicon gate 13, interlevel dielectric 15, contacts 17, and metal interconnect 19, with portions of gate 13 and metal interconnect 19 extending over dielectric 7. Those familiar with semiconductor processing will understand that the above sequence is intended as an example and that other sequences and processes can be used in the formation of an integrated circuit. For example, oxide and/or nitride levels may be used in the masking of an etch or implant. The result of the above process sequence, as may be modified by those familiar with semiconductor processing, is an integrated circuit on SOI material, with buried structures, such as trenches in the field region of the substrate as defined in the device level.

Figure 2:
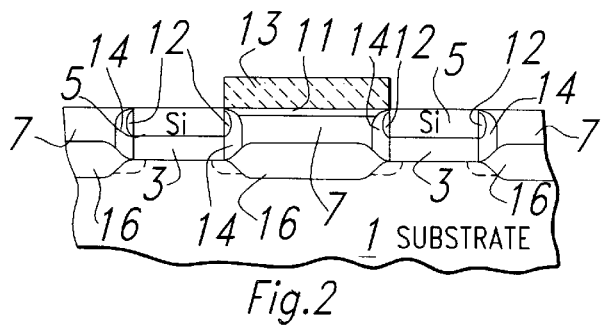
FIG. 2 is a cross sectional view of a partially fabricated integrated circuit in accordance with the present invention wherein a portion of the dielectric between the mesas is an oxidized surface portion of the substrate.

Referring now to FIG. 2, there is shown a second embodiment in accordance with the present invention. The substrate 1, buried oxide layer 3 and silicon layer 5 are the same as in FIG. 1 with patterning and etching also the same as in FIG. 1 except that etching ceases when the surface of the substrate 1 is exposed substantially without continuing etching partially into the substrate as was the case in the embodiment of FIG. 1. Optionally, the etching ceases with a portion of the buried oxide layer still covering the substrate. Doping of the substrate in the field regions (not shown in FIG. 2) can be provided at this time as in the embodiment of FIG. 1.

At this point in the process flow (this can also be done in the first embodiments described above), a sidewall dielectric and/or sidewall implant can be provided for either or both of the buried oxide layer 3 and silcon layer 5 in standard manner, if required. The sidewall dielectric is preferably initially a sidewall silicon oxide layer 12 over the exposed sidewall of the silicon layer 5 followed by a sidewall silicon nitride layer 14 over the oxide layer 12 and the exposed sidewall of the buried oxide layer 3. The structure is then thermally oxidized in standard manner to provide a silicon oxide layer 16 at the exposed portion of the substrate 1 between the mesa structures with oxide building up part way into the space between the mesas due to expansion the greater volume occupied by silicon oxide relative to elemental silicon. The remaining space between the mesas is then filled with a dielectric material 7 in the same manner as in FIG. 1. This embodiment provides extra depth to the dielectric between the mesa structures by virtue of the formation of silicon oxide into the substrate as well as upwardly from the substrate. Optionally, the dielectric 7 can be omitted if the grown oxide is sufficiently thick. Processing then continues as in the embodiment of FIG. 1 to provide a completed integrated circuit device including the interconnect 15.

Figure 3A:
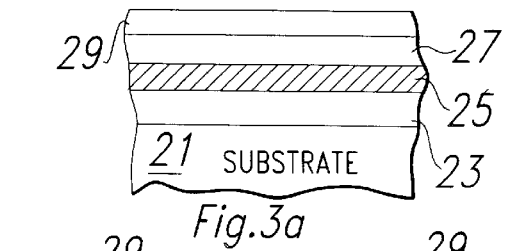
FIGS. 3a to 3d are cross sectional views of a third and fourth embodiment of a partially fabricated integrated circuit in accordance with the present invention.
Figure 3B:
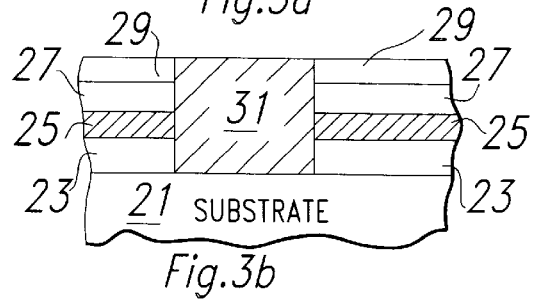
Figure 3C:
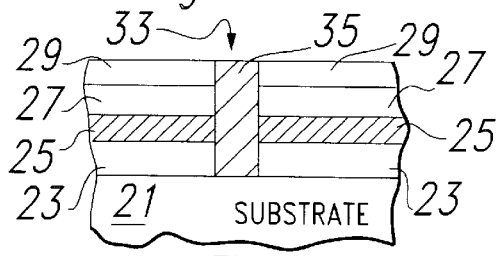
Figure 3D:
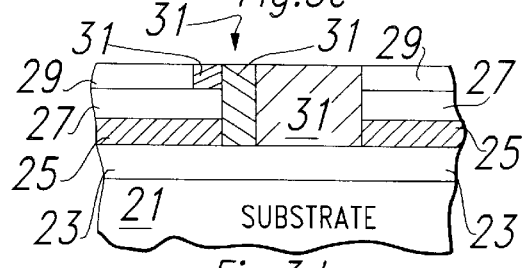

Referring now to FIGS. 3a to 3d, there are shown third and fourth embodiments in accordance with the present invention. Initially there is provided a substrate 21, preferably of silicon, having a first buried dielectric layer 23 thereover, preferably silicon dioxide. A buried electrically conductive layer 25, preferably doped single crystal silicon or polysilicon or a refractive metal such as tungsten, is provided over the dielectric layer 23. Alternatively, layer 25 may be non-conductive, such as undoped polysilicon or undoped single crystal silicon, which could be made selectively conductive by subsequent doping. A second buried dielectric layer 27, preferably silicon dioxide, is provided over the layer 25 and a silicon layer 29 is provided over the dielectric layer 27 as shown in FIG. 3a. The structure of FIG. 3a is then patterned and etched in standard manner as discussed above through each of the silicon layer 29, second buried dielectric layer 27 and buried layer 25 to the underlying buried oxide layer 23. Alternatively, the buried layer 25 can be etched with a different pattern. Optionally, implants or other structures, such as silicidation, can be provided in the buried layer. The space between the mesas and over the first buried dielectric layer 23 is then filled with a dielectric material 31 in the same manner as discussed hereinabove in connection with the embodiment of FIG. 1 to provide the structure as shown in FIG. 3b. Processing can then continue in accordance with the third embodiment as shown in FIG. 3c by patterning resist over one of the mesas and etching a via 33 to the buried layer 25. The via is then filled with an electrically conductive material 35, preferably tungsten, to interconnect the electrically conductive layers 25 and 29. As an alternative or in addition to the processing of FIG. 3c, in accordance with a fourth embodiment of the invention, the step of etching to form the mesa structures can include exposing a portion of the top surface of the buried electrically conductive layer 25 as shown in FIG. 3d. The region between the mesa structures is then filled with dielectric 31 as in FIG. 3b and a via 37 is formed in the dielectric material 31 with a contact 39 formed in the via 37 to the layer 25 to interconnect layers 25 and 29. Processing then continues as discussed above with reference to FIG. 1.

Figure 4:
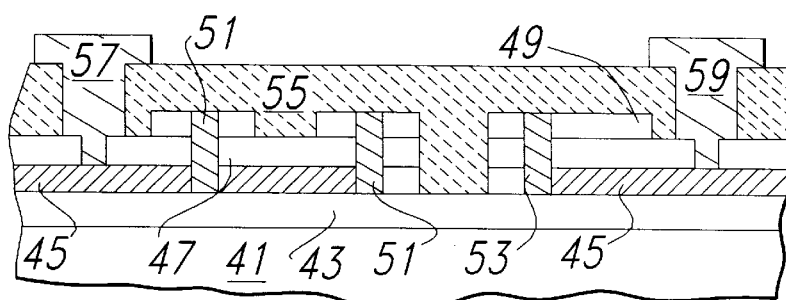
FIG. 4 is a circuit provided in accordance with the principles of the present invention wherein the patterned buried layer of the invention can be used to apply a different backgate bias to n-channel and p-channel transistors.

The patterned buried layer of the invention as described hereinabove can be used to apply a different backgate bias to n-channel and p-channel transistors. For example, negative bias can be applied to the n-channel and positive bias can be applied to the p-channel transistors to raise the transistion voltage ($V_T$) of both transistors simultaneously. The patterned buried layer can also be used to apply a different backgate voltage to different transistors or sections of transistors. This can be accomplished dynamically or statically. For example, a current control transistor can be given a different effective $V_T$ relative to the logic transistor. The patterned buried layer can also be used to bus different volatages. For example, both GND and $V_{DD}$ could be bussed in the patterned buried layer. The patterning can also be used to increase the isolation (reduce coupling via substrate) from one section of the circuit to another. An example of an implementation is shown in FIG. 4 wherein there is provided a substrate 41 with a first buried oxide layer 43 thereover. A patterned electrically conductive layer is patterned to have two electrically isolated sections 45' and 45". A patterned second buried oxide layer 47 has a patterned film of silicon 49 thereover. Vias with conductor therein 51 extend through the layers 49 and 47 to the buried layer 45' which is a buried ground plane and via with conductor therein 53 extends through the layers 49 and 47 to the buried layer 45" which is $V_{CC}$. As can also be seen, a dielectric 55 is disposed over the structure and also electrically isolates the mesa regions from each other over buried layer portion 45' and over buried layer portion 45". A ground buss 57 extends through dielectric 55 to the ground plane 45' and a $V_{CC}$ bus 59 extends through dielectric 55 the $V_{CC}$ buried layer portion 45".

With silicon on insulator (SOI), especially fully depleted, a "buried gate" or "backgate" can be used to change the effective front gate $V_T$. This can be used very effectively in memories where it is important to have low leakage and also compact high drive current. This applies to both DRAMs and SRMds.

Figure 5:
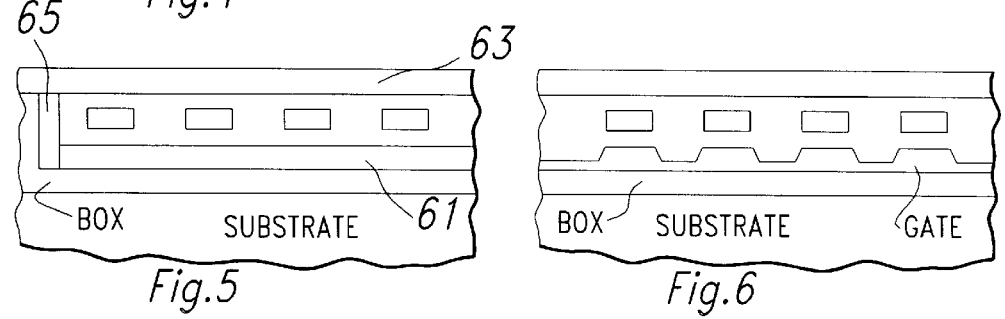
FIG. 5 shows the use of a "buried gate" or "backgate" with silicon on insulator to change the effective front gate VT.

With DRAMs, there are several options. One option, as shown in FIG. 5, is to have a back word line (W/L) 61 and a front W/L 63 that are both switched together via a conductor in a via 65 connecting together the word lines 61 and 63. This connection could be made at the driver or there can be several, distributing the connection. The latter is favorable if the W/L is long and the back W/L resistance becomes limiting (or if the back W/L is of superior conductivity and the front W/L resistance is limiting).

Another option is to have the back W/L controlled separately from the front W/L. The back W/L can be "turned on" (lowering the front gate $V_T$) in an active or block select mode and "off" (raising the front gate $V_T$) in standby or unselected mode.

Figure 6:
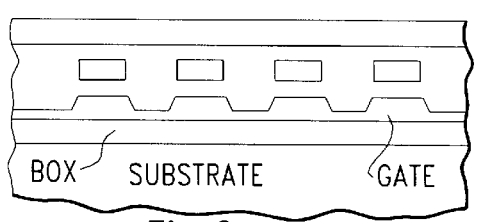
FIG. 6 shows the use of a "buried gate" or "backgate" where front and back gate are controlled separately.

In the first case, capacitive coupling of the front and back W/Ls is beneficial, so there is no need to increase the dielectric thickness between front and back W/Ls. For the case where front gate and back gate are controlled separately, it may be desirable to reduce the capacitive coupling, both to reduce load and to reduce noise. This can be accomplished as illustrated in FIG. 6.

SRAMs can use backgates in the same manner as DRAMs, i.e., have a back and front W/L to the pass gates. Back gates can also be used on the pull down transistor. For the pull-down transistor, it is desirable to have more drive current capacity during READ for cell stability and speed. On WRITE, it is not as critical, but there is some benefit to reducing the pull down drive. When the cell is not being read, it is desirable for the pull down transistors to have a relatively high $V_T$ to reduce leakage currents. One option is to have the backgate W/L go under the pull down transistor as well as the pass gates. Another option is to go under the pull down transistor. The back gates W/L can be controlled differently for READ and WRITE. Lowering the $V_T$ of the pull down transistor on READ while not switching the $V_T$ Of the pass transistor allows a stable memory cell with narrower pull down transistor. As with the DRAM W/Ls, this can be done in conjunction with the W/L and/or with standby or block select.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. An integrated circuit on SOI material comprising:
   (a) a semiconductor-on-insulator structure having a device layer and an electrically insulating layer having a first surface and an opposing surface, said device layer contacting said first surface;
   (b) an underlying layer of doped semiconductor material contacting said opposing surface of said electrically insulating layer, said underlying layer including regions of different doping type;
   (c) trenches defining a plurality of mesas extending from said underlying layer including said electrically insulating layer and said device layer, said trenches extending into said underlying layer and isolating said region of different doping type; and
   (d) an electrically insulating material disposed in and substantially filling said trenches and extending to said underlying layer.

2. The circuit of claim 1 wherein said underlying layer is one of a buried layer, a buried metal layer, a buried polysilicon layer or a substrate.

3. The circuit of claim 1 wherein said electrically insulating material extends into said underlying layer.

4. The circuit of claim 1 further including implanted ions disposed in said underlying layer.

5. The circuit of claim 2 wherein said electrically insulating material extends into said underlying layer.

6. The circuit of claim 2 wherein said electrically insulating material is a thermally oxidized portion of said underlying layer.

7. The circuit of claim 3 wherein said electrically insulating material is a thermally oxidized portion of said underlying layer.

8. The circuit of claim 5 wherein said electrically insulating material is a thermally oxidized portion of said underlying layer.

* * * * *